(12) United States Patent
Perry et al.

(10) Patent No.: US 7,457,177 B2
(45) Date of Patent: Nov. 25, 2008

(54) RANDOM ACCESS MEMORY INCLUDING CIRCUIT TO COMPRESS COMPARISON RESULTS

(75) Inventors: Rob Perry, Cary, NC (US); Norbert Rehm, Apex, NC (US); Jan Zieleman, Cary, NC (US); Rath Ung, Apex, NC (US); Dirk Fuhrmann, Apex, NC (US)

(73) Assignee: Infineon Technologies AG, Munich (DE)

(*) Notice: Subject to any disclaimer, the term of this patent is extended or adjusted under 35 U.S.C. 154(b) by 327 days.

(21) Appl. No.: 11/314,605

(22) Filed: Dec. 21, 2005

(65) Prior Publication Data

US 2007/0140024 A1    Jun. 21, 2007

(51) Int. Cl.
    *G11C 29/00*    (2006.01)
(52) U.S. Cl. .................. 365/201; 365/189.07
(58) Field of Classification Search ............... 324/763; 365/201, 189.07; 714/715, 718, 723
    See application file for complete search history.

(56) References Cited

U.S. PATENT DOCUMENTS

| | | | |
|---|---|---|---|
| 5,452,405 A | 9/1995 | Vondran, Jr. | 358/1.15 |
| 6,072,737 A * | 6/2000 | Morgan et al. | 365/201 |
| 6,550,026 B1 | 4/2003 | Wright et al. | 714/719 |
| 6,667,919 B1 | 12/2003 | Ma et al. | 365/201 |
| 6,880,117 B2 * | 4/2005 | Lin et al. | 714/718 |
| 6,904,552 B2 | 6/2005 | Cowles | 714/719 |
| 6,950,971 B2 * | 9/2005 | Boehler et al. | 714/710 |
| 2006/0136792 A1 * | 6/2006 | Hokenmaier | 714/718 |

* cited by examiner

*Primary Examiner*—Van Thu Nguyen
*Assistant Examiner*—Alexander Sofocleous
(74) *Attorney, Agent, or Firm*—Dicke, Billig & Czaja, PLLC

(57) ABSTRACT

A random access memory including an array of memory cells configured to store memory cell data, a first circuit, and a second circuit. The first circuit is configured to compare test data and memory cell data to obtain comparison results. The second circuit is configured to compress the comparison results and store the compressed comparison results.

21 Claims, 3 Drawing Sheets

RANDOM ACCESS MEMORY INCLUDING CIRCUIT TO COMPRESS COMPARISON RESULTS

BACKGROUND

Typically, a computer system includes a number of integrated circuit chips that communicate with one another to perform system applications. Chip speeds continue to increase and the amount of data communicated between chips continues to increase to meet the demands of system applications. As the volume of digital data communicated between chips increases, higher bandwidth communication links are developed to prevent data communication bottlenecks between chips.

Often, the computer system includes a controller, such as a micro-processor, and one or more memory chips, such as random access memory (RAM) chips. The RAM chips can be any suitable type of RAM, such as dynamic RAM (DRAM), double data rate synchronous DRAM (DDR-SDRAM), graphics DDR-SDRAM (GDDR-SDRAM), reduced latency DRAM (RLDRAM), pseudo static RAM (PSRAM), and low power DDR-SDRAM (LPDDR-SDRAM).

Typically, data and a strobe signal or clock signal are communicated between chips, such as a controller and a RAM, to read and write data. To write data to a chip, such as a RAM, data and a clock signal are transmitted to the chip and the received data is sampled via the received clock signal. To read data from the chip, data and a clock signal are transmitted from the chip. Higher bandwidth communication links can be made by increasing input/output (I/O) data bit speeds, such as by increasing the frequency of the output clock signal and outputting multiple data bits per clock cycle.

DDR-SDRAM chips output multiple data bits per clock cycle. Internally, DDR-SDRAM chips prefetch data bits from the DRAM memory core prior to outputting the data bits. Data bits can be prefetched in multiple bits per clock cycle, such as 2 bits per clock cycle or 4 bits per clock cycle. As the number of data bits prefetched per clock cycle increases, the output data rate from the DRAM can be increased, such as by increasing the frequency of the output clock signal and increasing the number of data bits output per clock cycle. These trends, of increasing the frequency of the output clock signal and outputting more data bits per clock cycle, are expected to continue into the future.

Current test systems are often not able to capture output data bits at the output clock signal frequency. Also, current test systems are often not able to capture multiple data bits per clock cycle. Test methods, such as slowing the output clock signal, can be used to read data from the memory chips. However, slowing the output clock signal increases test time, which increases the cost of each of the memory chips.

For these and other reasons there is a need for the present invention.

SUMMARY

One aspect of the present invention provides a random access memory including an array of memory cells configured to store memory cell data, a first circuit, and a second circuit. The first circuit is configured to compare test data and memory cell data to obtain comparison results. The second circuit is configured to compress the comparison results and store the compressed comparison results.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
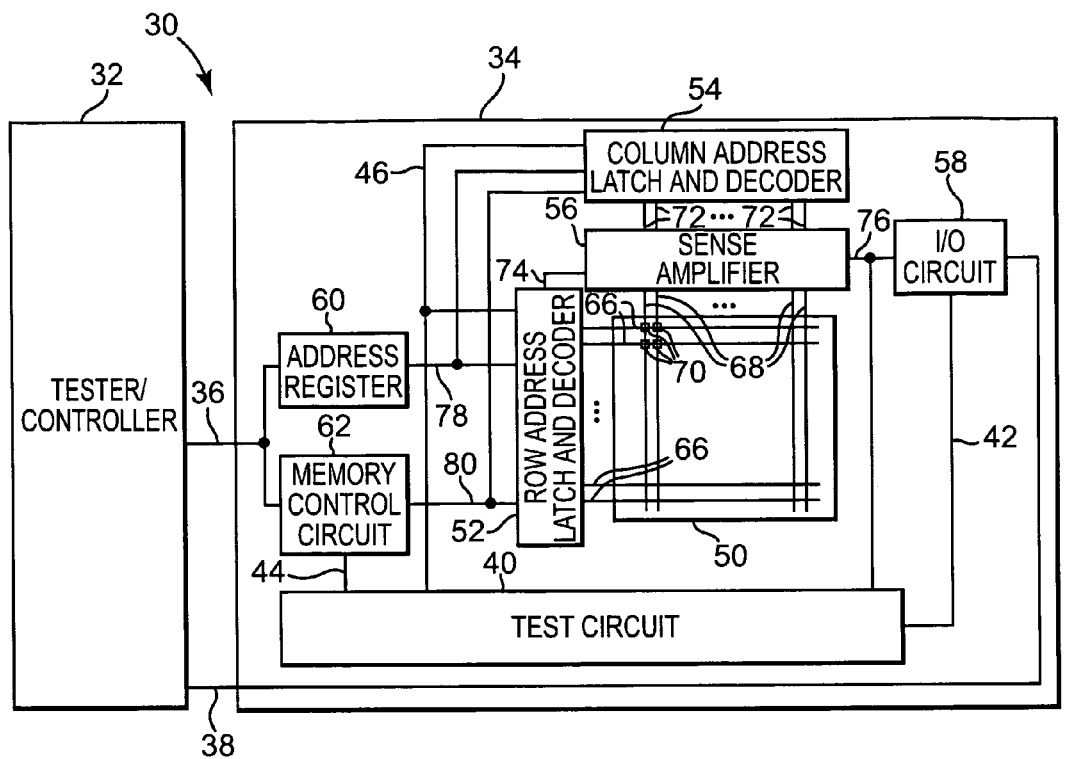
FIG. 1 is a block diagram illustrating one embodiment of a computer system according to the present invention.

FIG. 1 is a block diagram illustrating one embodiment of a computer system 30 according to the present invention. Computer system 30 includes a tester/controller 32 and a RAM 34. Tester/controller 32 is electrically coupled to RAM 34 via memory communications path 36 and data communications path 38. Tester/controller 32 provides row and column addresses and control signals to RAM 34 via memory communications path 36. Tester/controller 32 provides data and strobe signals to RAM 34 and receives data and strobe signals from RAM 34 via data communications path 38. RAM 34 can be any suitable type of RAM, such as a DRAM, DDR-SDRAM, GDDR-SDRAM, LPDDR-SDRAM, RLDRAM, and a PSRAM.

RAM 34 includes a test circuit 40 that compares data in RAM 34 to a test pattern or test data and provides compressed comparison results. RAM 34 is put into a test mode via tester/controller 32 and data is written into memory cells of RAM 34. Test circuit 40 reads the stored data from the memory cells and compares the data that is read from the memory cells to a test pattern to obtain pass/fail comparison results. The comparison results indicate whether the memory cells pass or fail data retention tests. Test circuit 40 compresses the comparison results that correspond to a number of memory cells and stores the compressed comparison results. Test circuit 40 and RAM 34 output compressed comparison results to tester/controller 32. In one embodiment, data is read from memory cells at a first data rate and compressed comparison results are output at a second data rate, where the first data rate is faster than the second data rate.

In one embodiment, test circuit 40 compares data that is read from one row of memory cells to, a test pattern and obtains a row of comparison results. The row of comparison results is logically compared to a row of register values and the register values are updated to the result of the logical comparison. Next, test circuit 40 compares data that is read from another row of memory cells to a test pattern and obtains another row of comparison results that are logically compared to the updated row of register values. Again, the register values are updated to the result of the logical comparison. This continues until a set number of rows of memory cells have been tested. The resulting register values are the compressed comparison results.

In one embodiment, the set number of rows of memory cells that are tested to obtain compressed comparison results is equal to the redundancy resolution of RAM 34, such that the smallest number of rows to be replaced with redundant rows is tested and the comparison results are compressed and stored. In one embodiment, the smallest number of rows to be replaced is four. In one embodiment, the smallest number of rows to be replaced is eight. In other embodiments, any suitable number of rows of memory cells can be tested and the comparison results can be compressed and stored. In other embodiments, test circuit 40 compares any suitable number of memory cells to a test pattern and logically compares any suitable number of comparison results and stores any suitable number of compressed comparison results.

RAM 34 includes an array of memory cells 50, a row address latch and decoder 52, a column address latch and decoder 54, a sense amplifier circuit 56, a RAM I/O circuit 58, an address register 60, and a memory control circuit 62. Conductive word lines 66, referred to as row select lines, extend in the x-direction across the array of memory cells 50. Conductive bit lines 68, referred to as digit lines, extend in the y-direction across the array of memory cells 50. Memory cells 70 are located at the cross points of word lines 66 and bit lines 68.

Each word line 66 is electrically coupled to row address latch and decoder 52 and each bit line 68 is electrically coupled to one of the sense amplifiers in sense amplifier circuit 56. Row address latch and decoder 52 is electrically coupled to sense amplifier circuit 56 via communications path 74. Sense amplifier circuit 56 is electrically coupled to column address latch and decoder 54 via conductive column select lines 72. Also, sense amplifier circuit 56 is electrically coupled to test circuit 40 and to RAM I/O circuit 58 via I/O communications path 76 and RAM I/O circuit 58 is electrically coupled to test circuit 40 via test output communications path 42. Data is transferred between RAM I/O circuit 58 and tester/controller 32 via data communications path 38.

Tester/controller 32 is electrically coupled to address register 60 and control circuit 62 via memory communications path 36. Address register 60 is electrically coupled to row address latch and decoder 52 and column address latch and decoder 54 via row and column address lines 78. Control circuit 62 is electrically coupled to row address latch and decoder 52 and column address latch and decoder 54 via control communications path 80. Also, control circuit 62 is electrically coupled to test circuit 40 via test circuit communications path 44 and test circuit 40 is electrically coupled to row address latch and decoder 52 and column address latch and decoder 54 via communications path 46.

Row address latch and decoder 52 receives row addresses and RAS signals and latches the row addresses into row address latch and decoder 52. Row address latch and decoder 52 decodes each of the row addresses to select a word line 66 or row of memory cells 70. Also, row address latch and decoder provides sense amplifier control signals and equalization and pre-charge signals to sense amplifier circuit 56 via communications path 74.

Column address latch and decoder 54 activates column select lines 72 to couple sense amplifiers in sense amplifier circuit 56 to I/O communications path 76. Column address latch and decoder 54 receives a column address and latches the column address into column address latch and decoder 54. Column address latch and decoder 54 decodes the column address to select addressed column select lines 72. In addition, column address latch and decoder 54 receives column select line activation signals from control circuit 62 via control communications path 80. The column select line activation signals indicate which of the addressed column select lines 72 are to be activated by column address latch and decoder 54. Column address latch and decoder 54 activates column select lines 72 that are addressed by the column address and selected for activation by the column select line activation signals. Activated column select lines 72 are provided to sense amplifier circuit 56 to couple sense amplifiers in sense amplifier circuit 56 to test circuit 40 and I/O circuit 58.

Sense amplifier circuit 56 includes sense amplifiers and equalization and pre-charge circuits. Each of the sense amplifiers is a differential input sense amplifier. A pair of bit lines 68 is coupled to the differential inputs of a sense amplifier, wherein one of the bit lines 68 receives a data bit from a selected memory cell 70 and the other bit line 68 is used as a reference. One of the equalization and pre-charge circuits is situated across the pair of bit lines 68 to equalize the voltage on the bit lines 68 prior to a read or write operation.

To read a data bit, a sense amplifier amplifies the difference between the data bit value and the reference value and provides a sensed output value to test circuit 40 and I/O circuit 58 via I/O communications path 76. To write a data bit, tester/controller 32 provides a data bit to I/O circuit 58 via data communications path 38. I/O circuit 58 provides the data bit to a sense amplifier in sense amplifier circuit 56 via I/O communications path 76. I/O circuit 58 overdrives the sense amplifier to overdrive the data bit value onto the bit line 68 that is connected to one of the memory cells 70 and to overdrive the inverse of the data bit value onto the reference bit line 68. The sense amplifier writes the received data bit value into the selected memory cell 70.

Tester/controller 32 and I/O circuit 58 communicate via data communications path 38. I/O circuit 58 includes a suitable number of transmitter and receiver pairs and tester/controller 32 includes a suitable number of transmitter and receiver pairs. Each transmitter and receiver pair in I/O circuit 58 corresponds to a transmitter and receiver pair in tester/controller 32. Data communications path 38 includes one or more signal lines and each transmitter and receiver pair in I/O circuit 58 is electrically coupled to the corresponding transmitter and receiver pair in tester/controller 32 via one of the signal lines in data communications path 38.

Tester/controller 32 provides addresses and control signals to RAM 34 via memory communications path 36. Tester/controller 32 configures RAM 34 via control circuit 62 to operate in a test mode or a normal mode. In one embodiment, tester/controller 32 is a system controller coupled to RAM 34 in an electronic computer system. In one embodiment, tester/controller is a test system that tests RAM 34 at wafer test. In one embodiment, tester/controller is a test system that tests RAM 34 at package test.

In normal mode, tester/controller 32 provides row and column addresses to address register 60 via memory communications path 36. Address register 60 supplies a row address to row address latch and decoder 52 via row and column address lines 78, and control circuit 62 supplies a RAS signal to row address latch and decoder 52 via control communications path 80 to latch the supplied row address into row address latch and decoder 52. Address register 60 supplies a column address to column address latch and decoder 54 via row and column address lines 78, and control circuit 62 supplies a CAS signal to column address latch and decoder 54 via control communications path 80 to latch the supplied column address into column address latch and decoder 54.

Also, in normal mode, tester/controller 32 provides addresses and control signals to control circuit 62 via memory communications path 36. Control circuit 62 receives the addresses and control signals from tester/controller 32 and provides internal control signals to read data from or write data into the array of memory cells 50. Control circuit 62 provides RAS signals to row address latch and decoder 52 and CAS signals to column address latch and decoder 54. Also, control circuit 62 provides internal control signals to column address latch and decoder 52 to selectively activate column select lines 72. In one embodiment, RAM 34 is a PSRAM and tester/controller 32 provides SRAM control signals to control circuit 62. The SRAM control signals do not include DRAM control signals, such as RAS and CAS signals, and control circuit 62 provides the DRAM control signals in response to the SRAM control signals.

In test mode, tester/controller 32 provides addresses and control signals to control circuit 62 via memory communications path 36. Control circuit 62 receives the addresses and control signals from tester/controller 32 and provides addresses and control signals to test circuit 40 via test circuit communications path 44. Test circuit 40 provides test addresses and control signals to control circuit 62 via test circuit communications path 44 and to row address latch and decoder 52 and column address latch and decoder 54 via communications path 46. Row address latch and decoder 52 and column address latch and decoder 54 provide latched addresses for testing memory cells 70 in the array of memory cells 50.

During a normal mode read operation, control circuit 62 receives read control signals and address register 60 receives the row address of a selected memory cell or cells 70. The row address is supplied from address register 60 to row address latch and decoder 52 and latched into row address latch and decoder 52 by control circuit 62 that provides a RAS signal. Row address latch and decoder 52 decodes the row address and provides control signals to sense amplifier circuit 56. Also, row address latch and decoder 52 activates the selected word line 66. As the selected word line 66 is activated, the value stored in each memory cell 70 coupled to the selected word line 66 is passed to the respective bit line 68. The bit value stored at a memory cell 70 is detected by the sense amplifier that is electrically coupled to the respective bit line 68.

Next, control circuit 62 and address register 60 receive the column address of the selected memory cell or cells 70. The column address is supplied from address register 60 to column address latch and decoder 54 and latched into column address latch and decoder 54 by control circuit 62 that provides a CAS signal. The column address latch and decoder 54 decodes the column address to select column select lines 72. Control circuit 62 provides internal control signals to column address latch and decoder 54 to selectively activate column select lines 72 and couple selected sense amplifiers to output circuitry in I/O circuit 58. I/O circuit 58 receives sensed output values and outputs data and strobe signals. The sensed output values are provided to transmitter and receiver pairs in I/O circuit 58 and to the corresponding transmitter and receiver pairs in tester/controller 32 via data communications path 38.

During a normal mode write operation, data to be stored in the array of memory cells 50 is supplied from transmitter and receiver pairs in tester/controller 32 to transmitter and receiver pairs in I/O circuit 58 via data communications path 38. Control circuit 62 receives write control signals and address register 60 receives the row address of a selected memory cell or cells 70. The row address is supplied from address register 60 to row address latch and decoder 52 and latched into row address latch and decoder 52 by control circuit 62 that provides a RAS signal. Row address latch and decoder 52 decodes the row address and provides control signals to sense amplifier circuit 56. Also, row address latch and decoder 52 activates the selected word line 66. As the selected word line 66 is activated, the value stored in each memory cell 70 coupled to the selected word line 66 is passed to the respective bit line 68 and the sense amplifier that is electrically coupled to the respective bit line 68.

Next, control circuit 62 and address register 60 receive the column address of the selected memory cell or cells 70. Address register 60 supplies the column address to column address latch and decoder 54 and the column address is latched into column address latch and decoder 54 by control circuit 62 via a CAS signal. Column address latch and decoder 54 receives column select line activation signals from control circuit 62 and activates selected column select lines 72 to couple sense amplifiers in sense amplifier circuit 56 to transmitter and receiver pairs in I/O circuit 58. I/O circuit 58 passes data from tester/controller 32 to the sense amplifiers and overdrives the sense amplifiers to write data to the selected memory cell or cells 70 via bit lines 68.

In test mode operation, tester/controller 32 configures one or more test mode registers in control circuit 62 and test circuit 40. The test mode registers are configured to put RAM 34 into test mode and select tests to be performed via test circuit 40. A test pattern is loaded into a test mode register and memory cells 70 in the array of memory cells 50 are written to contain the test pattern. In one embodiment, memory cells 70 are written with data via a write operation similar to the normal mode write operation. In one embodiment, test circuit 40 writes the test pattern into memory cells 70 by transmitting addresses and control signals to control circuit 62 via test circuit communications path 44 and to row address latch and decoder 52 and column address latch and decoder 54 via communications path 46.

Next, test circuit 40 reads the stored data from memory cells 70 by providing addresses and control signals to control circuit 62, row address latch and decoder 52, and column address latch and decoder 54. Row address latch and decoder 52 and column address latch and decoder 54 provide latched addresses for reading the memory cells 70. Test circuit 40 receives data from memory cells 70 via I/O communications path 76 and compares the received data to the test pattern. The pass/fail comparison results indicate whether the memory cells 70 are good memory cells 70. Test circuit 40 compresses the comparison results and stores the compressed comparison results. Test circuit 40 outputs the compressed comparison results to I/O circuit 58 via test output communications path 42 and I/O circuit 58 outputs the compressed comparison results to tester/controller 32. The output data rate from I/O circuit 58 is controlled to slow the data rate, which enables tester/controller 32 to read the compressed comparison results. Test circuit 40 reads at least some of the data from memory cells 70 at a first data rate and outputs the compressed comparison results via I/O circuit 58 at a second data rate, where the first data rate is faster than the second data rate.

In one embodiment, test circuit 40 compares data that is read from one row of memory cells 70 to the test pattern and obtains a row of comparison results. The row of comparison results is logically compared to a corresponding row of register values, where one of the comparison results in the row of comparison results is logically compared to a corresponding one of the register values in the row of register values. The row of register values is updated to the results of the logical comparison. Next, test circuit 40 compares data that is read from another row of memory cells 70 to the test pattern and obtains another row of comparison results that are logically compared to the updated row of register values. Again, the row of register values is updated to the results of the logical comparison. This continues until a set number of rows of memory cells 70 have been tested. The resulting row of register values are the compressed comparison results output to tester/controller 32.

In one embodiment, the set number of rows of memory cells 70 tested to obtain compressed comparison results is a group of rows of memory cells 70 that may be replaced via a redundant set of rows of memory cells 70. The group of rows of memory cells 70 is tested and the comparison results compressed and stored. The comparison results are output and the next group of rows of memory cells 70 is tested and the comparison results compressed and stored. This continues until all memory cells 70 are tested, including the redundant sets of rows of memory cells 70. In one embodiment, all of the rows in a group are read at the first data rate. In one embodiment, all but the last row in a group are read at the first data rate and the last row in the group is read at the second data rate. In one embodiment, all of the rows of memory cells 70 in the array of memory cells 50 are read, compared, and compressed into one compressed comparison result, such as at package test.

Figure 2:
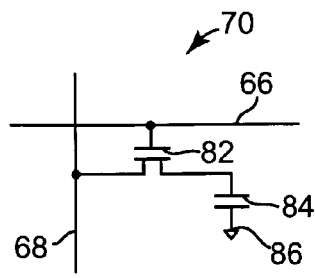
FIG. 2 is a diagram illustrating one embodiment of a dynamic random access memory cell in the array of memory cells.

FIG. 2 is a diagram illustrating one embodiment of a dynamic random access memory cell 70 in the array of memory cells 50. Memory cell 70 includes a single transistor 82 and a single capacitor 84. The gate of transistor 82 is electrically coupled to a word line 66. One side of the drain-source path of transistor 82 is electrically coupled to a bit line 68 and the other side of the drain-source path is electrically coupled to one side of capacitor 84. The other side of capacitor 84 is electrically coupled to a reference 86, such as one-half the supply voltage. Capacitor 84 is charged and discharged to represent logic 1 or logic 0.

During a read operation, a high voltage level is provided on word line 66 to turn on transistor 82. The data bit value stored on capacitor 84 is read by a sense amplifier via bit line 68. During a write operation, a high voltage level is provided on word line 66 to turn on transistor 82 and access capacitor 84. The sense amplifier connected to bit line 68 is overdriven to write a data bit value on capacitor 84 via bit line 68 and transistor 82.

A read operation on memory cell 70 is a destructive operation. After each read operation, capacitor 84 is recharged or discharged to the logic level that was just read. During the read operation, the sense amplifier senses the data bit value stored at memory cell 70 and amplifies the sensed data bit value to provide the maximum high logic level or the minimum low logic level, whichever was just read, on bit line 68. This amplified value is stored back on capacitor 84 via deactivating word line 66.

In addition, even without read operations, the charge on capacitor 84 discharges over time. To retain a stored data bit value, dynamic random access memory cells, such as memory cell 70, are refreshed periodically by reading and/or writing memory cell 70. All memory cells 70 in the array of memory cells 50 are periodically refreshed to maintain their data bit values. In self refresh mode, RAM 34 periodically addresses and substantially reads each of the memory cells 70 to refresh their data bit values.

Figure 3:
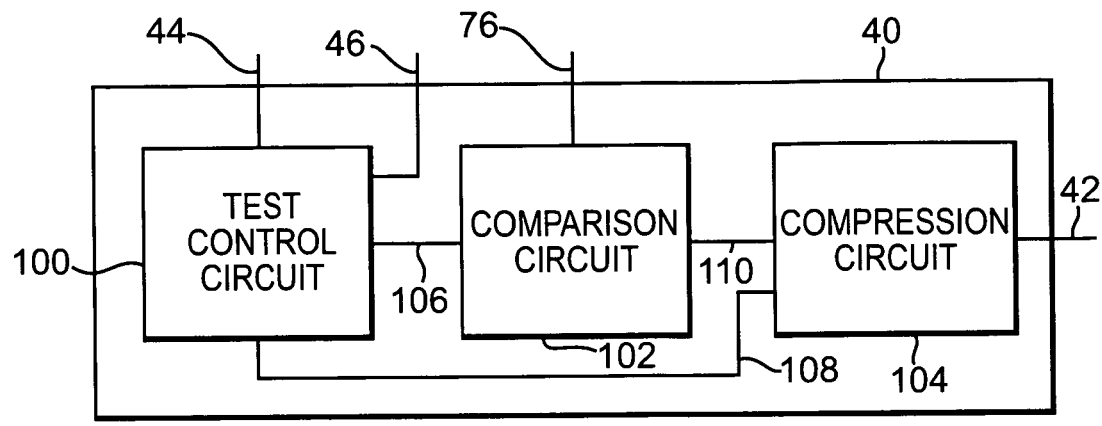
FIG. 3 is a diagram illustrating one embodiment of a test circuit in the RAM.

FIG. 3 is a diagram illustrating one embodiment of test circuit 40 in RAM 34. In other embodiments, test circuit 40 can be situated in any suitable integrated circuit, such as application specific integrated circuits and other memory circuits.

Test circuit 40 includes a test control circuit 100, a comparison circuit 102, and a compression circuit 104. Test control circuit 100 is electrically coupled to comparison circuit 102 via comparison circuit communications path 106 and to compression circuit 104 via compression circuit communications path 108. Comparison circuit 102 is electrically coupled to compression circuit 104 via comparison result communications path 10. Comparison circuit communications path 106 includes any suitable number of electrical paths for coupling test control circuit 100 to comparison circuit 102 and compression circuit communications path 108 includes any suitable number of electrical paths for coupling test control circuit 100 to compression circuit 104. Also, comparison result communications path 110 includes any suitable number of electrical paths for coupling comparison circuit 102 to compression circuit 104.

Test control circuit 100 controls operation of test circuit 40. Test control circuit 100 receives addresses and control signals from memory control circuit 62 via test circuit communications path 44. Test control circuit 100 includes test mode registers that are loaded via control circuit 62. The test mode registers are loaded to put test control circuit 100 into test mode and to select a test to be performed via test circuit 40. In one embodiment, a test mode register is loaded with a test pattern that is written into memory cells 70 of RAM 34 and later compared to data read back from memory cells 70.

Test control circuit 100 controls writing data into and reading data from memory cells 70. Test control circuit 100 provides test addresses and control signals to control circuit 62 via test circuit communications path 44 and to row address latch and decoder 52 and column address latch and decoder 54 via communications path 46. Row address latch and decoder 52 and column address latch and decoder 54 provide latched addresses for testing memory cells 70 in the array of memory cells 50.

Also, test control circuit 100 controls comparing the data that is read from the memory cells 70 to the test pattern to obtain pass/fail comparison results. Test control circuit 100 provides control signals and a test pattern to comparison circuit 102 via communications path 106. In addition, test control circuit 100 controls compression of comparison results and outputting compressed comparison results via compression circuit 104. Test control circuit 100 provides control signals and other signals, such as output trigger signals, to compression circuit 104 via communications path 108. In one embodiment, test control circuit 100 provides addresses to compression circuit 104 to address storage registers in compression circuit 104.

Comparison circuit 102 compares data received from memory cells 70 to a test pattern and provides pass/fail comparison results. Comparison circuit 102 receives control signals and a test pattern from test control circuit 100 via communications path 106 and comparison circuit 102 receives data that is read from memory cells 70 in the array of memory cells 50 via I/O communications path 76. Comparison circuit 102 compares the data received from the memory cells 70 to the test pattern and provides pass/fail comparison results. The pass/fail comparison results indicate whether a memory cell 70 is good and reliably retains data or bad and fails to retain data. Comparison circuit 102 provides the comparison results to compression circuit 104 via comparison result communications path 110. In one embodiment, comparison circuit 102 includes multiple comparison circuits, wherein each of the multiple comparison circuits corresponds to one column of memory cells 70 in the array of memory cells 50, including redundant columns of memory cells 70.

Compression circuit 104 compresses the received comparison results and stores the compressed comparison results. Also, compression circuit 104 outputs the compressed comparison results via test output communications path 42. In one embodiment, compression circuit 104 logically compares each received comparison result to a register value and updates the register value to the result of the logical comparison. In one embodiment, compression circuit 104 compares each comparison result from one column of memory cells 70 to a corresponding register value and the corresponding register value is updated to hold the compressed comparison result for the one column of memory cells 70.

Test control circuit 100 provides a clock signal to RAM 34 to read data from memory cells 70 at a first clock frequency and a first data rate and test control circuit 100 slows the clock signal to output compressed comparison results from compression circuit 104 and RAM 34 at a second clock frequency and a second data rate, where the first data rate is faster than the second data rate. The compressed comparison results are output from RAM 34 at the second data rate, such that a tester can read the results. In one embodiment, the second clock frequency is equal to one half of the first clock frequency. In one embodiment, test control circuit 100 and RAM 34 provide a 4n prefetch to read four memory cells 70 during each cycle of the clock signal at the first clock frequency and provide a first data rate that is four times the first clock frequency. In one embodiment, test control circuit 100 and RAM 34 provide two compressed comparison results for each cycle of the clock signal at the second clock frequency and provide a second data rate that is equal to two times the second clock frequency.

In one embodiment, test control circuit 100 reads data from a first row of memory cells 70 to provide a first row of data. Comparison circuit 102 receives the first row of data and compares the first row of data to a test pattern to obtain a first row of comparison results. Compression circuit 104 receives the first row of comparison results and compares the first row of comparison results to a row of register values that were previously reset to either logical 0's or logical 1's. The register values are updated to the result of the first compression circuit comparison. Also, test control circuit 100 reads data from a second row of memory cells 70 to provide a second row of data. Comparison circuit 102 receives the second row of data and compares the second row of data to a test pattern to obtain a second row of comparison results. Compression circuit 104 receives the second row of comparison results and compares the second row of comparison results to the row of register values, which were previously updated to the result of the first compression circuit comparison. The register values are updated to the result of the second compression circuit comparison. This procedure continues for a set number of rows of memory cells 70, where the resulting row of register values is the compressed comparison results for the rows of memory cells 70 read via test control circuit 100. Each bit in the resulting row of register values indicates whether any of the memory cells 70 in a column of memory cells 70 are bad. The resulting row of register values, which are the compressed comparison results, are output from the compression circuit 104 and RAM 34 at the second frequency and the second data rate.

In one embodiment, the set number of rows of memory cells 70 is equal to the redundancy resolution of RAM 34 and testing is done at wafer test to identify rows of memory cells 70 that need to be replaced by redundant rows of memory cells 70. In one embodiment, the set number of rows of memory cells 70 is equal to a redundancy resolution of four rows of memory cells 70. In one embodiment, the set number of rows of memory cells 70 is equal to a redundancy resolution of eight rows of memory cells 70. In one embodiment, the set number of rows of memory cells 70 is equal to all of the rows of memory cells 70 that will be used, including redundant rows of memory cells 70 and excluding replaced rows of memory cells 70, and testing is done at package test to identify whether RAM 34 is good and can be used or bad and should be discarded. In other embodiments, the set number of rows of memory cells 70 can be any suitable number of rows of memory cells 70.

In one embodiment, the set number of rows of memory cells 70 is equal to a redundancy resolution of four rows of memory cells 70. Test control circuit 100 reads data from the first row of memory cells 70 at the first data rate and comparison circuit 102 compares the first row of data to the test pattern to obtain a first row of comparison results at substantially the first data rate. Compression circuit 104 compares the first row of comparison results to the row of register values, which were previously reset to either logical 0's or logical 1's, and the register values are updated to the result of this first compression circuit comparison at substantially the first data rate. Next, test control circuit 100 reads data from the second row of memory cells 70 at the first data rate and comparison circuit 102 compares the second row of data to the test pattern to obtain a second row of comparison results at substantially the first data rate. Compression circuit 104 compares the second row of comparison results to the row of register values, which were previously updated to the result of the first compression circuit comparison, and the register values are updated to the result of this second compression circuit comparison at substantially the first data rate. Next, test control circuit 100 reads data from the third row of memory cells 70 at the first data rate and comparison circuit 102 compares the third row of data to the test pattern to obtain a third row of comparison results at substantially the first data rate. Compression circuit 104 compares the third row of comparison results to the row of register values, which were previously updated to the result of the second compression circuit comparison, and the register values are updated to the result of this third compression circuit comparison at substantially the first data rate. Next, test control circuit 100 reads data from the fourth row of memory cells 70 at the second data rate and comparison circuit 102 compares the fourth row of data to the test pattern to obtain a fourth row of comparison results at substantially the second data rate. Compression circuit 104 compares the fourth row of comparison results to the row of register values, which were previously updated to the result of the third compression circuit comparison, and the register values are updated to the result of this fourth compression circuit comparison at substantially the second data rate. The resulting row of register values is the final compressed comparison results for the four rows of memory cells 70, where each bit in the resulting row of register values indicates whether any of the memory cells 70 in a column of four memory cells 70 are bad. The final compressed comparison results are output from the compression circuit 104 and RAM 34 at the second frequency and the second data rate. Outputting the final compressed comparison results for the four rows of memory cells 70 can be done at any suitable time, such as while the register values are updated via the result of the fourth compression circuit comparison or after updating is completed.

In another embodiment, test control circuit 100 also reads data from the fourth row of memory cells 70 at the first data rate and comparison circuit 102 compares the fourth row of data to the test pattern to obtain a fourth row of comparison results at substantially the first data rate. Compression circuit 104 compares the fourth row of comparison results to the row of register values, which were previously updated to the result of the third compression circuit comparison, and the register values are updated to the result of this fourth compression circuit comparison at substantially the first data rate. The resulting row of register values is the final compressed comparison results for the four rows of memory cells 70, where each bit in the resulting row of register values indicates whether any of the memory cells 70 in a column of four memory cells 70 are bad. The final compressed comparison results are output from the compression circuit 104 and RAM 34 at the second frequency and the second data rate after the fourth update.

In operation of test circuit 40, tester/controller 32 provides control signals to control circuit 62 to put RAM 34 into test mode and select a test to be performed. Control circuit 62 receives the control signals from tester/controller 32 and provides control signals to test control circuit 100. Control circuit 62 loads a test pattern into a test mode register in test control circuit 100 and loads other test mode registers in test control circuit 100 to put RAM 34 into test mode. The test mode registers indicate the test to be performed via specifying test characteristics.

Test control circuit 100 writes the test pattern into the memory cells 70. Test control circuit 100 provides addresses and control signals to control circuit 62, row address latch and decoder 52, and column address latch and decoder 54 to write the test pattern into the memory cells 70. The RAM 34 may be stressed after writing the test pattern into the memory cells 70. In another embodiment, the test pattern is written into the memory cells 70 via a write operation similar to the normal mode write operation.

Next, test control circuit 100 provides addresses and control signals to control circuit 62, row address latch and decoder 52, and column address latch and decoder 54 to read the memory cells 70. Test control circuit 100 reads at least some of the memory cells 70 at a first data rate and outputs the compressed comparison results at a second data rate, where the first data rate is faster than the second data rate. Also, test control circuit 100 provides the test pattern to comparison circuit 102 and resets register values in compression circuit 104.

Comparison circuit 102 receives the data that is read from the memory cells 70 and compares the received data to the test pattern to obtain pass/fail comparison results. The pass/fail comparison results indicate whether a memory cell 70 is good and reliably retains data or bad and fails to retain data. Comparison circuit 102 provides the comparison results to compression circuit 104.

Compression circuit 104 compresses the received comparison results via logically comparing each received comparison result to a register value and updating the register value to the result of the logical comparison. The updated register value that is stored is a compressed comparison result. In one embodiment, compression circuit 104 compares each comparison result from one column of memory cells 70 to a corresponding register value and the corresponding register value is updated to hold the compressed comparison result for the one column of memory cells 70

Test control circuit 100 provides control signals and/or clock signals to compression circuit 104 and RAM 34 to output the compressed comparison results. Compression circuit 104 outputs the compressed comparison results to I/O circuit 58 that outputs the compressed comparison results to tester/controller 32. Test control circuit 100 controls the output data rate, i.e., the second data rate, and slows the second data rate to enable tester/controller 32 to read the compressed comparison results.

Figure 4:
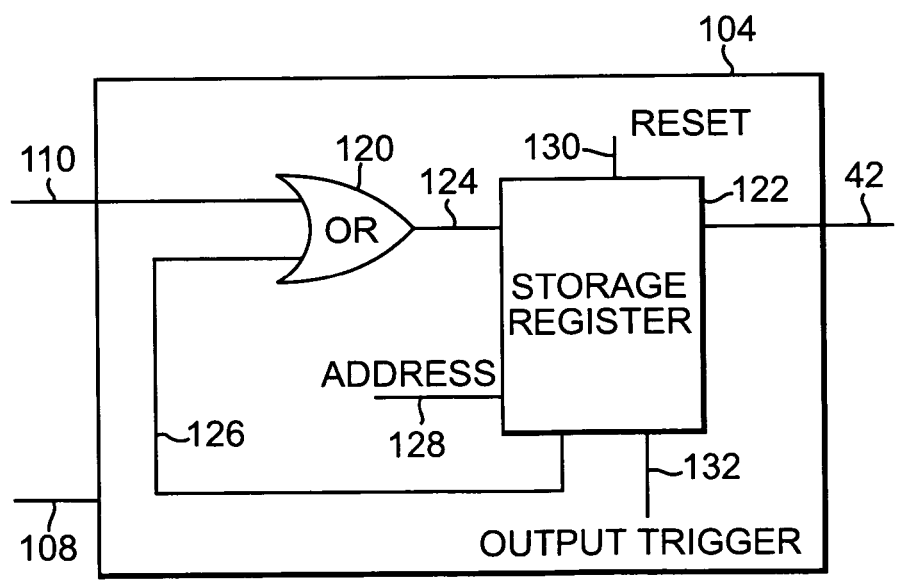
FIG. 4 is a block diagram illustrating one embodiment of a compression circuit in the test circuit of FIG. 3.

FIG. 4 is a block diagram illustrating one embodiment of compression circuit 104 in test circuit 40. Compression circuit 104 receives pass/fail comparison results from comparison circuit 102 via comparison result communications path 110, and compression circuit 104 receives control signals and address signals from test control circuit 100 via compression circuit communications path 108. Compression circuit 104 provides register values and/or compressed comparison results to I/O circuit 58 via test output communications path 42.

Compression circuit 104 includes an OR gate 120 and a storage register 122. OR gate 120 is electrically coupled to register 122 via logical comparison output path 124 and register value input path 126. OR gate 120 receives pass/fail comparison results at one input via communications path 110 and register values from register 122 via register value input path 126. OR gate 120 logically compares the received pass/fail comparison results to the received register values and provides a logical comparison result to register 122 via logical comparison output path 124. The logical comparison result is stored back in register 122 to update the register value.

Register 122 receives address signals via address path 128, a reset signal via reset input path 130, and an output trigger signal via output trigger path 132. The address signals, reset signal, and output trigger signal are received from test control circuit 100 via compression circuit communications path 108. Also, register 122 receives logical comparison results from OR gate 120 via logical comparison output path 124. In one embodiment, the address signals are controlled via an external signal. In one embodiment, the address signals are generated internally and provided via test control circuit 100.

Register 122 includes multiple registers, where each of the multiple registers is independently addressable via the received address signals. Register 122 receives an address and provides a corresponding register value to OR gate 120 via register value input path 126. OR gate 120 logically compares the addressed register value to a received pass/fail comparison result that corresponds to the addressed register. OR gate 120 provides the logical comparison result to register 122, which stores the logical comparison result, i.e., the updated register value, in the addressed register.

In one embodiment, register 122 includes a full row of registers, i.e., a full page of registers, and each register in the row of registers corresponds to one column in the array of memory cells 50, including redundant columns. A pass/fail comparison result from one of the columns is compared to the register value from the register that corresponds to the column, which is addressed via the address signals. The resulting logical comparison result is stored in the addressed register.

Register 122 receives the reset signal from test control circuit 100 via reset input path 130. Register 122 clears each of the multiple registers to a logical 0 in response to an active reset signal. A pass/fail comparison result that indicates a pass is represented via a logical 0 and a pass/fail comparison result that indicates a fail is represented via a logical 1. If a pass/fail comparison result indicates a memory cell failure via a logical 1, the addressed register value is updated to a logical 1. The updated register outputs the indicated memory cell failure and is cleared to a logical 0 via another active reset signal. In one embodiment, the reset signal is controlled via an external signal. In one embodiment, the reset signal is linked to the output trigger signal and the reset signal is activated after register values have been output.

Register 122 receives output trigger signals from test control circuit 100 via output trigger path 132. Register 122 outputs register values via test output communications path 42 in response to one or more active output trigger signals. In one embodiment, register 122 outputs register values after obtaining the final compressed comparison results. In one embodiment, register 122 outputs register values after every update. In one embodiment, register 122 outputs updated register values continuously. In one embodiment, the output trigger signal is controlled via an external trigger source. In one embodiment, the output trigger signal is linked to the row address and output is triggered when leaving a row address domain. In one embodiment, all register values in register 122 are output in a predetermined sequence in response to an active output trigger signal. In one embodiment, register 122 receives address signals, such as column addresses, that address registers to output register values from the addressed registers.

In another embodiment, compression circuit 104 includes a row of OR gates and a row of registers. Each OR gate, in the row of OR gates, is electrically coupled to one register in the row of registers. Each column of memory cells 70 in a row of memory cells 70, including redundant columns, is electrically coupled to one of the OR gate and register pairs. Since, each of the OR gate and register pairs is dedicated to a column of memory cells 70, address signals are not needed to address registers. Compression circuit 104 receives any suitable number of pass/fail comparison results in parallel via comparison result communications path 110, and compression circuit 104 receives any suitable number of control signals and address signals via compression circuit communications path 108. In addition, compression circuit 104 provides any suitable number of compressed comparison results in parallel via test output communications path 42.

In operation of one embodiment, test control circuit 100 provides an active reset signal to register 122, which clears each of the multiple registers in register 122 to a logical 0. Test control circuit 100 provides address signals to register 122 to address one of the multiple registers in register 122. The register value from the addressed register is provided to one input of OR gate 120 and the other input of OR gate 120 receives a pass/fail comparison result that corresponds to the addressed register. OR gate 120 logically compares the addressed register value to the received pass/fail comparison result.

In the first logical comparison of a cleared register, if the pass/fail comparison result indicates a passing memory cell via a logical 0, the logical comparison result is a logical 0 and the addressed register value is updated to remain at a logical 0. If the pass/fail comparison result indicates a memory cell failure via a logical 1, the logical comparison result is a logical 1 and the addressed register value is updated to a logical 1. OR gate 120 provides the logical comparison result to register 122, which stores the logical comparison result, i.e., the updated register value, in the addressed register.

In subsequent logical comparisons of an addressed register, OR gate 120 continues to logically OR the addressed register value to a received pass/fail comparison result to obtain the logical comparison result. OR gate 120 provides the logical comparison result to register 122, which stores the logical comparison result in the addressed register. Test control circuit 100 continues supplying address signals to register 122 to update the addressed registers to the logical comparison results. This continues until all memory cells 70 in a group, such as the set number of rows of memory cells 70, have been tested.

The final compressed comparison results are stored in register 122 and test control circuit 100 provides one or more output trigger signals to register 122. Register 122 receives the output trigger signals and outputs register values in response to the one or more active output trigger signals. In one embodiment, all register values in register 122 are output in a predetermined sequence in response to an active output trigger signal. In one embodiment, test control circuit 100 provides output address signals, such as column addresses, to register 122 and register 122 outputs each of the addressed registers in response to an active output trigger signal. After the register values are output, test control circuit 100 provides an active reset signal to clear each of the multiple registers in register 122 to a logical 0.

Figure 5:
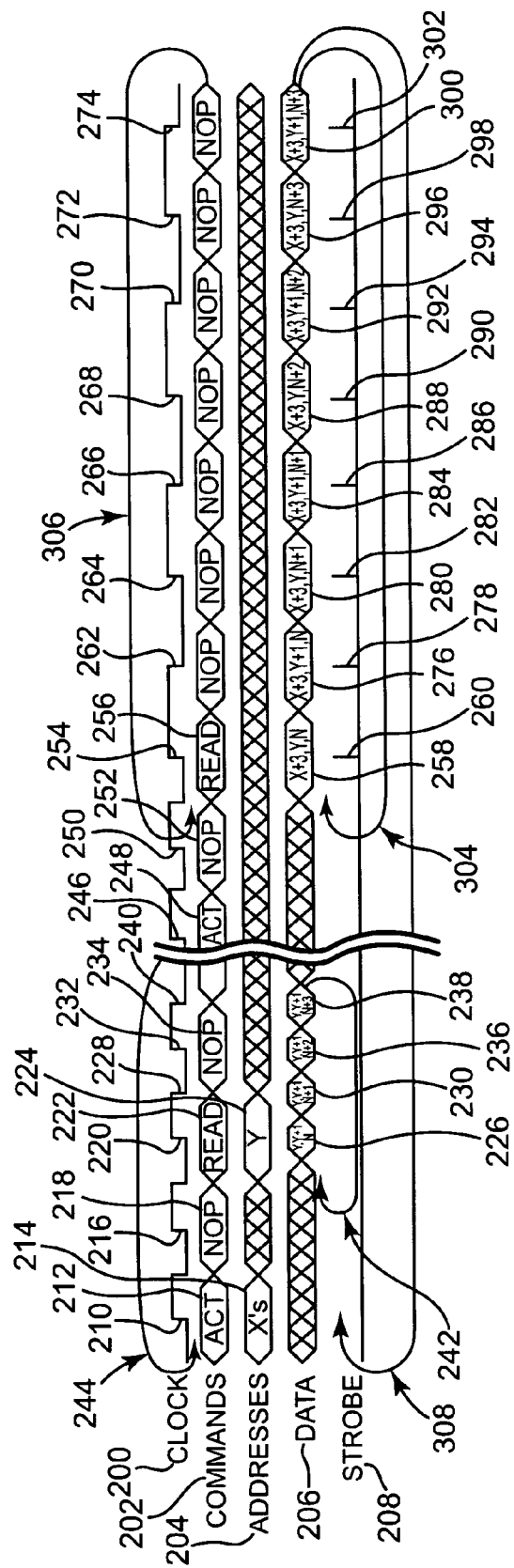
FIG. 5 is a timing diagram illustrating one example operation of one embodiment of the test circuit of FIG. 3.

FIG. 5 is a timing diagram illustrating one example operation of one embodiment of test circuit 40 in RAM 34. A tester, such as tester/controller 32, provides control signals to control circuit 62 to put RAM 34 into test mode and select a test to be performed. Control circuit 62 provides control signals to test control circuit 100 and loads test mode registers in test control circuit 100 to put RAM 34 into test mode and specify testing characteristics. In one embodiment, a test pattern is indicated via the test mode registers. In one embodiment, the test pattern is loaded into a test mode register. In one embodiment, the test pattern is selected via one or more bits in a test mode register.

The test pattern is written into memory cells 70 in the array of memory cells 50 and RAM 34 may be stressed to test data retention capabilities of the memory cells 70. In one embodiment, test control circuit 100 writes the test pattern into memory cells 70. In one embodiment, the test pattern is written into the memory cells 70 via normal mode write operations.

RAM 34 receives the clock signal at 200 via an external circuit, such as tester/controller 32 or an external clock circuit controlled by tester/controller 32. Test control circuit 100 provides commands at 202 and addresses at 204 to read data from memory cells 70 in the array of memory cells 50. Addresses at 204 and control signals are provided to control circuit 62, row address latch and decoder 52, and column address latch and decoder 54 to read the memory cells 70. In one embodiment, initial addresses are provided via the tester, such as tester/controller 32. In one embodiment, initial addresses and incrementing of addresses are provided via the test control circuit 100 and based on test mode register values.

Data at 206 is read from the memory cells 70 and comparison circuit 102 compares the data to the test pattern to obtain pass/fail comparison results. Comparison circuit 102 provides the comparison results to compression circuit 104, which compresses the received comparison results. Compression circuit 104 compares each received comparison result to a register value and updates the register value to the result of the compression circuit comparison. The updated register value is a compressed comparison result. In one embodiment, compression circuit 104 compares each comparison result from one column of memory cells 70 to a corresponding register value and the corresponding register value is updated to hold the compressed comparison result for the one column of memory cells 70.

Test control circuit 100 provides control signals and clock signals to compression circuit 104 to output the compressed comparison results. Compression circuit 104 outputs the compressed comparison results to I/O circuit 58 that outputs the compressed comparison results from RAM 34. The tester, such as tester/controller 32, samples outputs from RAM 34 via the strobe signal at 208.

In this example, the number of rows of memory cells 70 to be read, pass/fail compared, and compressed to obtain one set of final compressed comparison results is equal to a redundancy resolution of four rows of memory cells 70. Also, in this example, RAM 34 has four banks of memory cells 70 and each row of memory cells 70 is spread across all four banks of memory cells 70.

At a first frequency and a first rising edge, indicated at 210 of clock signal 200, test control circuit 100 provides a select memory bank and activate row command (ACT) at 212 and a row address X at 214. The row address X at 214 is latched into row address latch and decoder 52 to select the first of four rows of memory cells 70 to be tested. At the second rising edge 216 of clock signal 200, test control circuit 100 provides a no operation command (NOP) at 218 and at the third rising edge 220 of clock signal 200, test control circuit 100 provides a read command (READ) at 222 and a column address Y at 224. The column address Y at 224 is latched into column address latch and decoder 54 to select columns of memory cells 70 to be read.

Test control circuit 100 reads out four bits of data per clock cycle beginning with the third rising edge 220 and continuing for two clock cycles and a total of eight data bits. Two bits of data are read at 226 at the third rising edge 220, one from each of an odd and an even column in the first bank N, and two bits of data are read at 230 at the falling edge at 228 of clock signal 200, one from each of an odd and an even column in the second bank N+1. At the fourth rising edge 232 of clock signal 200, test control circuit 100 provides a NOP command at 234 and four bits of data are read in the fourth clock cycle. Two bits of data are read at 236 at the fourth rising edge 232, one from each of an odd and an even column in the third bank N+2, and two bits of data are read at 238 at the falling edge at 240 of clock signal 200, one from each of an odd and an even column in the fourth bank N+3. Thus, eight bits of data are read from the first row of memory cells 70.

Next, the column address is incremented by two and eight more bits of data are read from the four banks of N, N+1, N+2, and N+3, as indicated by the loop at 242. Two bits of data, one bit from an odd column and one bit from an even column, are read from each of the four memory banks. The loop at 242 is repeated to read the entire row of memory cells 70. In one embodiment, the loop at 242 is repeated 512 times.

Data is read at the first data rate in loop 242, where the first data rate is four times the first frequency at 210 of the clock signal at 200. The data is received by comparison circuit 102 at the first data rate and compared to the test pattern to obtain pass/fail comparison results. Comparison circuit 102 provides the comparison results to compression circuit 104, which compares each received comparison result to a register value and updates the register value to the result of the compression circuit comparison at substantially the first data rate.

Next, at loop 244 and repeating at first rising edge 210, test control circuit 100 provides another ACT command at 212 and row address X+1 at 214. The row address X+1 at 214 is latched into row address latch and decoder 52 to select the second of the four rows of memory cells 70 to be tested. At the second rising edge 216, test control circuit 100 provides a NOP command at 218 and at the third rising edge 220 test control circuit 100 provides a READ command at 222 and column address Y at 224. Column address Y at 224 is latched into column address latch and decoder 54 to select columns of memory cells 70 to be read. In another embodiment, the row address can be automatically incremented and the column address and bank address can be automatically reset to initial values.

Test control circuit 100 reads out four bits of data per clock cycle beginning with the third rising edge 220 and continuing for two clock cycles and a total of eight data bits from the second row. Two bits of data are read at 226 at the third rising edge 220, one from each of an odd and an even column in the first bank N, and two bits of data are read at 230 at the falling edge at 228, one from each of an odd and an even column in the second bank N+1. At the fourth rising edge 232 of clock signal 200, test control circuit 100 provides a NOP command at 234 and four bits of data are read in the fourth clock cycle. Two bits of data are read at 236 at the fourth rising edge 232, one from each of an odd and an even column in the third bank N+2, and two bits of data are read at 238 at the falling edge at 240 of clock signal 200, one from each of an odd and an even column in the fourth bank N+3. Thus, eight bits of data are read from the second row of memory cells 70.

As with the first row of memory cells 70, the column address is incremented by two and eight more bits of data are read from the four banks of N, N+1, N+2, and N+3, at loop 242. Two bits of data, one bit from an odd column and one bit from an even column, are read from each of the four memory banks. The loop at 242 is repeated to read the entire second row of memory cells 70. In one embodiment, the loop at 242 is repeated 512 times.

Data is read at the first data rate in loop 242, where the first data rate is four times the first frequency of the clock signal at 200. The data is received by comparison circuit 102 at the first data rate and compared to the test pattern to obtain pass/fail comparison results. Comparison circuit 102 provides the comparison results to compression circuit 104, which compares each received comparison result to a register value and updates the register value to the result of the compression circuit comparison at substantially the first data rate.

At loop 244 and repeating at first rising edge 210, test control circuit 100 provides another ACT command at 212 and row address X+2 at 214. The row address X+2 at 214 is latched into row address latch and decoder 52 to select the third of the four rows of memory cells 70 to be tested. At the second rising edge 216, test control circuit 100 provides a NOP command at 218 and at the third rising edge 220 test control circuit 100 provides a READ command at 222 and column address Y at 224. Column address Y at 224 is latched into column address latch and decoder 54 to select columns of memory cells 70 to be read. In another embodiment, the row address can be automatically incremented and the column address and bank address can be automatically reset to initial values.

Test control circuit 100 reads out four bits of data per clock cycle beginning with the third rising edge 220 and continuing for two clock cycles and a total of eight data bits from the third row. Two bits of data are read at 226 at the third rising edge 220, one from each of an odd and an even column in the first bank N, and two bits of data are read at 230 at the falling edge at 228, one from each of an odd and an even column in the second bank N+1. At the fourth rising edge 232 of clock signal 200, test control circuit 100 provides a NOP command at 234 and four bits of data are read in the fourth clock cycle. Two bits of data are read at 236 at the fourth rising edge 232, one from each of an odd and an even column in the third bank N+2, and two bits of data are read at 238 at the falling edge at 240 of clock signal 200, one from each of an odd and an even column in the fourth bank N+3. Thus, eight bits of data are read from the third row of memory cells 70.

As with the first row and the second row of memory cells 70, the column address is incremented by two and eight more bits of data are read from the four banks of N, N+1, N+2, and N+3, as indicated by loop 242. Two bits of data, one bit from an odd column and one bit from an even column, are read from each of the four memory banks. The loop at 242 is repeated to read the entire third row of memory cells 70. In one embodiment, the loop at 242 is repeated 512 times.

Data is read at the first data rate in loop 242, where the first data rate is four times the first frequency of the clock signal at 200. The data is received by comparison circuit 102 at the first data rate and compared to the test pattern to obtain pass/fail comparison results. Comparison circuit 102 provides the comparison results to compression circuit 104, which compares each received comparison result to a register value and updates the register value to the result of the compression circuit comparison at substantially the first data rate.

Next, at the rising edge at 246 of clock signal 200, test control circuit 100 provides another ACT command at 248 and the row address is incremented to row address X+3. The row address X+3 is latched into row address latch and decoder 52 to select the fourth of the four rows of memory cells 70 to be tested. At the rising edge at 250, test control circuit 100 provides a NOP command at 252 and at the rising edge at 254 test control circuit 100 provides a READ command at 256. The column address Y and bank address N are automatically reset to initial values. Also, the frequency of clock signal 200 is decreased to a second frequency at 254. In one embodiment, the second frequency at 254 is substantially one half of the first frequency at 210 of clock signal 200.

Test control circuit 100 reads out two bits of data per clock cycle beginning with the rising edge at 254 and continuing for four clock cycles and a total of eight data bits. One bit of data is read at 258 from the first bank N at the rising edge at 254 and received by comparison circuit 102. Comparison circuit 102 compares the received data bit to the test pattern to obtain a pass/fail comparison result. Compression circuit 104 compares the received pass/fail comparison result to the corresponding register value and updates the register value to the final compressed comparison result. Next, test control circuit 100 outputs this final compressed comparison result at the second data rate, where the second data rate is equal to two times the second frequency. The tester, such as tester/controller 32, provides a strobe signal at 260 to sample the final compressed comparison result.

At each of the falling edges 262, 266, 270, and 274 of clock signal 200 and at each of the rising edges 264, 268, and 272 of clock signal 200, test control circuit 100 provides a NOP command and another data bit is read from memory cells 70 in the array of memory cells 50. At the falling edge at 262, another data bit at 276 is read from the first bank N to obtain a final compressed comparison result. The tester reads the final compressed comparison result via the strobe signal at 278. At the rising edge at 264, a data bit at 280 is read from the second bank N+1 to obtain a final compressed comparison result. The tester reads the final compressed comparison result via the strobe signal at 282. At the falling edge at 266, another data bit at 284 is read from the second bank N+1 to obtain a final compressed comparison result. The tester reads the final compressed comparison result via the strobe signal at 286. At the rising edge at 268, a data bit at 288 is read from the third bank N+2 to obtain a final compressed comparison result. The tester reads the final compressed comparison result via the strobe signal at 290. At the falling edge at 270, another data bit at 292 is read from the third bank N+2 to obtain a final compressed comparison result. The tester reads the final compressed comparison result via the strobe signal at 294. At the rising edge at 272, a data bit at 296 is read from the fourth bank N+3 to obtain a final compressed comparison result. The tester reads the final compressed comparison result via the strobe signal at 298. At the falling edge at 274, another data bit at 300 is read from the fourth bank N+3 to obtain a final compressed comparison result. The tester reads the final compressed comparison result via the strobe signal at 302. Thus eight bits of data are read from the fourth row of memory cells 70 and eight final compressed comparison results are output from RAM 34 at the second data rate.

Next, the column address is incremented by two and the loop at 304 is repeated to begin at the rising edge at 254. Loop 304 is repeated to read a burst length of data bits from each memory bank. Next, the column address is incremented and the loop at 306 is repeated to begin the process of reading the next burst length of data bits from each of the four memory banks. Loops 304 and 306 are repeated until all of the columns in the fourth row X+3 are read and the final compressed comparison results have been obtained and output at the second data rate. In one embodiment, the burst length is eight and loop 304 is repeated three times for a total of four times and loop 306 is repeated 127 times for a total of 128 times to complete reading the fourth row of memory cells 70.

At loop 308, after each set of four rows of memory cells 70 have been tested, test control circuit 100 increments the row address to test the next set of four rows of memory cells 70. In one embodiment, loop 308 is repeated 2047 times for a total of 2048 times. In one embodiment, testing continues until all rows of memory cells 70, including redundant rows of memory cells 70, in RAM 34 are tested.

In another embodiment, test control circuit 100 reads data from the fourth row of memory cells 70 at the first data rate and comparison circuit 102 compares the fourth row of data to the test pattern to obtain comparison results at substantially the first data rate. Compression circuit 104 compares the comparison results to the row of register values and updates the register values at substantially the first data rate. The resulting row of register values is the final compressed comparison results for the four rows of memory cells 70, where each bit in the resulting row of register values indicates whether any of the memory cells 70 in a column of four memory cells 70 are bad. The final compressed comparison results are output from the compression circuit 104 and RAM 34 at the second frequency and the second data rate.

Test circuit 40 reads at least some of the data from RAM 34 at a first data rate and provides a pass/fail comparison and compression of the pass/fail comparison results at the first data rate. Test circuit 40 may read other data from RAM 34 at a second data rate and provide a pass/fail comparison and compression of the pass/fail comparison results at the second data rate, where the first data rate is faster than the second data rate. Test circuit 40 outputs each of the compressed comparison results at the second data rate after obtaining the final compressed comparison results. By reading, comparing, and compressing pass/fail comparison results at the first data rate, test circuit 40 reduces the test time of RAM 34 and the per unit cost of RAM 34.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A random access memory comprising:
an array of memory cells configured to store memory cell data;
a first circuit configured to compare test data and memory cell data to obtain comparison results; and
a second circuit configured to compress the comparison results and store the compressed comparison results, wherein the second circuit is configured to receive each of the comparison results and compare each of the comparison results to a stored value to obtain one of the compressed comparison results, wherein the stored value is updated to the one of the compressed comparison results.

2. The random access memory of claim 1, comprising:
a third circuit configured to read memory cell data from memory cells in the array of memory cells at a first data rate and to output the compressed comparison results via the second circuit at a second data rate, wherein the first data rate is faster than the second data rate.

3. A random access memory comprising:
an array of memory cells configured to store memory cell data;
a first circuit configured to compare test data and memory cell data to obtain comparison results;
a second circuit configured to compress the comparison results and store the compressed comparison results; and
a control circuit configured to read memory cell data from memory cells in the array of memory cells at a first data rate to provide the memory cell data to the first circuit and configured to output the compressed comparison results via the second circuit at a second data rate, wherein the first data rate is faster than the second data rate, wherein the control circuit is configured to read memory cells via first word lines in a row redundancy group at the first data rate and to read memory cells via a last word line in the row redundancy group at the second data rate to obtain the compressed comparison results.

4. The random access memory of claim 3, wherein the first data rate is at a first clock rate and the second data rate is at a second clock rate that is substantially one half of the first clock rate.

5. A random access memory comprising an array of memory cells configured to have rows of memory cells;
a first circuit configured to read memory cell data from each of the rows of memory cells in the array of memory cells;
a second circuit configured to receive the memory cell data from each of the rows of memory cells and to compare the memory cell data from each of the rows of memory cells to test data and provide row comparison results; and
a third circuit configured to receive each of the row comparison results and compare each of the row comparison results to stored values to obtain compressed results, wherein the stored values are updated to the compressed results and the first circuit is configured to output stored values via the third circuit.

6. The random access memory of claim 5, wherein the third circuit comprises;
a fourth circuit configured to compare each of the row comparison results to stored values via a logic function to obtain compressed results; and
a fifth circuit configured to update the stored values to the compressed results.

7. The random access memory of claim 6, wherein the fourth circuit is configured to compare each of the row comparison results to stored values via an OR gate function and the fifth circuit comprises a register configured to update the stored values to the compressed values and store the updated stored values.

8. The random access memory of claim 7, comprising bit lines that cross the array of memory cells and each of the bit lines provides memory cell data from memory cells in one column of the array of memory cells, wherein the third circuit comprises OR gates and registers and each of the bit lines provides data from memory cells in one column to a corresponding one of the OR gates that supplies an OR gate result to a corresponding one of the registers.

9. The random access memory of claim 7, wherein the third circuit comprises registers that are addressed via a column address to update the stored values to the compressed results and to output the stored values.

10. A random access memory comprising means for storing memory cell data in an array of memory cells;
means for comparing the memory cell data and test data to obtain comparison results;
means for compressing the comparison results; and
means for storing the compressed comparison results, wherein the means for compressing the comparison results comprises:
means for comparing each of the comparison results to a stored value to obtain one of the compressed comparison results.

11. The random access memory of claim 10, comprising:
means for reading memory cell data from memory cells in the array of memory cells at a first data rate; and
means for outputting the compressed comparison results at a second data rate that is slower than the first data rate.

12. The random access memory of claim 11, wherein the means for reading memory cell data comprises:
means for reading first memory cell data from the memory cells at the first data rate; and
means for reading second memory cell data from the memory cells at the second data rate.

13. The random access memory of claim 10, wherein the means for storing the compressed comparison results comprises:
means for updating the stored value to the one of the compressed comparison results.

14. A method for testing a random access memory, comprising:
storing data in the random access memory;
comparing the stored data and test data to obtain comparison results via a first circuit in the random access memory;
compressing the comparison results via a second circuit in the random access memory;
storing the compressed comparison results in the random access memory;
reading first stored data in the random access memory at a first data rate to provide the first stored data to the first circuit;
outputting the compressed comparison results via the second circuit at a second data rate that is slower than the first data rate;
reading the first stored data via first word lines in a row redundancy group at the first data rate; and
reading second stored data via a last word line in the row redundancy group at the second data rate to obtain the compressed comparison results.

15. A method for testing a random access memory, comprising:

storing data in the random access memory;

comparing the stored data and test data to obtain comparison results via a first circuit in the random access memory;

compressing the comparison results via a second circuit in the random access memory; and storing the compressed comparison results in the random access memory, wherein compressing the comparison results comprises:

comparing each of the comparison results to a stored value to obtain one of the compressed comparison results.

16. The method of claim 15, wherein storing the compressed comparison results comprises:

updating the stored value to the one of the compressed comparison results.

17. A method for testing a random access memory, comprising:

storing data in rows of memory cells in the random access memory;

reading stored data from one of the rows of memory cells;

comparing the stored data from the one of the rows of memory cells to test data to obtain row comparison results via a first circuit in the random access memory;

comparing the row comparison results to register values to obtain compressed results via a second circuit in the random access memory;

updating the register values to the compressed results; and outputting the register values from the random access memory.

18. The method of claim 17, wherein comparing the row comparison results comprises comparing the row comparison results to the register values via a logic function to obtain the compressed results.

19. The method of claim 17, wherein comparing the row comparison results comprises comparing the row comparison results to the register values via an OR gate function.

20. The method of claim 17, wherein reading stored data from one of the rows of memory cells comprises reading stored data from one of the rows of memory cells at a first data rate, and wherein outputting the register values comprises outputting the register values at a second data rate that is slower than the first data rate.

21. The method of claim 17, comprising:

reading stored data via first word lines in a row redundancy group at a first data rate; and reading stored data via a last word line in the row redundancy group at a second data rate that is slower than the first data rate.

* * * * *